United States Patent [19]
Wei

[11] Patent Number: 5,342,794
[45] Date of Patent: Aug. 30, 1994

[54] METHOD FOR FORMING LATERALLY GRADED DEPOSIT-TYPE EMITTER FOR BIPOLAR TRANSISTOR

[75] Inventor: Yi-Hen Wei, Saratoga, Calif.

[73] Assignee: VLSI Technology, Inc., San Jose, Calif.

[21] Appl. No.: 73,843

[22] Filed: Jun. 7, 1993

Related U.S. Application Data

[63] Continuation-in-part of Ser. No. 943,072, Sep. 10, 1992, abandoned.

[51] Int. Cl.$^5$ ..................... H01L 21/265; H01L 29/70
[52] U.S. Cl. ........................ 437/31; 437/35; 437/44; 437/59; 148/DIG. 11; 257/370; 257/591
[58] Field of Search ............ 437/31, 35, 44, 59; 148/DIG. 10, 11; 257/370, 591

[56] References Cited

U.S. PATENT DOCUMENTS

| | | | |
|---|---|---|---|
| 5,100,810 | 3/1992 | Yoshimi et al. | 437/21 |
| 5,147,809 | 9/1992 | Won et al. | 437/31 |
| 5,198,692 | 3/1993 | Momose | 257/591 |
| 5,270,227 | 12/1993 | Kameyama et al. | 437/35 |

FOREIGN PATENT DOCUMENTS

2283032  11/1990  Japan .................................. 257/370

Primary Examiner—Olik Chaudhuri
Assistant Examiner—Long Pham
Attorney, Agent, or Firm—Clifton L. Anderson

[57] ABSTRACT

The present invention provides a BiCMOS integrated circuit with bipolar, NMOS and PMOS transistors. In a bipolar transistor, an emitter buffer is provided to minimize a hot carrier effect. The emitter buffer is implanted using the same mask used for a base link. However, the n-type dopant is implant using a large angle, while the p-type dopant is implanted using a normal implant. A "base" oxide is grown over the implant region. This oxide ultimate isolates the emitter buffer from the polysilicon emitter contact section. Local interconnects are formed using a "dual-gate" technique, in which a tungsten silicide cap layer is formed over polysilicon to short pn junctions in the interconnect.

4 Claims, 5 Drawing Sheets

METHOD FOR FORMING LATERALLY GRADED DEPOSIT-TYPE EMITTER FOR BIPOLAR TRANSISTOR

BACKGROUND OF THE INVENTION

This is a continuation-in-part of copending patent application Ser. No. 07/943,072, filed Sep. 10, 1992, now abandoned.

The present invention relates to integrated circuits and, more particularly, to fabrication of a bipolar transistor. A major objective of the present invention is to provide a high-performance bipolar transistor in which a "hot-carrier effect" is minimized.

Much of modern technological progress is associated with advances in semiconductor processing that have provided greater speed and integration in electrical circuits. The basic building blocks of these circuits are transistors, which typically serve as electric switches, detectors and amplifiers. Of several alternative transistor processing technologies, of primary interest herein is BiCMOS, which integrates bipolar and CMOS technology. In a BiCMOS device, bipolar transistors typically use oxide isolation over a base region; the oxide isolation subjects the transistors to a hot-carrier effect that impairs the performance. The hot-carrier effect also impairs non-BiCMOS bipolar transistors using oxide isolation. However, some non-BiCMOS technologies use junction isolation and do not suffer from this effect.

Both NPN and PNP bipolar transistors are known. A NPN bipolar transistor comprises a p-type base sandwiched between an n-type emitter and an n-type collector. In a PNP bipolar transistor, the conductivity types of the active regions are reversed. The following discussion focuses on the operation of an NPN bipolar transistor. Those skilled in the art can make the appropriate substitution of conductivity types and potential differences that apply to the PNP bipolar transistor.

The collector of an NPN bipolar transistor is normally biased at a higher potential than the emitter. No current flows from the emitter to the collector unless the base to emitter junction is forward biased. A small base current induces electrons to flow from the emitter to the collector. In this case, the emitter current $I_e$ and the base current $I_b$ are collected by the collector as the collector current $I_c$. The ratio of the collector current $I_c$ to the base current $I_b$ is referred to as the transistor gain $\beta$.

Bipolar transistors commonly employ a "simple" emitter that is constituted by a heavily doped region in the semiconductor substrate that also includes the transistor base. Higher performance can be attained using a "deposit-type" emitter that includes both a heavily doped contact section above the substrate in which the base is defined and a relatively shallow substrate section. The contact section is typically heavily doped polysilicon.

In some cases, deposit-type emitters impose tighter than normal tolerances. For a first example, the etch that defines the contact section often must end at a polysilicon/silicon boundary. This boundary is not readily detected by end point technique. Accordingly, relies on precise timing to complete the etch without damaging the silicon substrate.

For a second example, the contact section and substrate section generally share an area in common with their mutual boundary. For small devices, this limits the tolerances available for metallization vias to contact the emitter contact section. This limitation can be addressed by running the emitter poly out to a broader contact pad. However, this consumes even more area.

To provide for interconnection, access to the active transistor components is typically provided at the substrate surface, which is the top of the epitaxial layer where one is employed, and the top of the original wafer crystal, where no epitaxial layer is employed. Conductive contacts, for example, of metal, polysilicon, and/or amorphous silicon can be formed on the substrate surface to provide the required access to the base, emitter and collector. An emitter contact can be formed directly over a simple emitter, while the contact section of a deposit-type emitter can serve as its contact.

Polysilicon interconnects must be doped to render them conductive. In BiCMOS circuits, it is often convenient to dope some polysilicon n-type and other polysilicon p-type. This can result in diode junctions in the interconnects. In a "dual-gate" technique, the junctions can be shorted by patterning a conductive material over and concurrently with the polysilicon.

A base contact can be defined directly over the base at a location laterally spaced from the emitter contact. To reduce contact resistance, the section of the base directly below the base contact is much more heavily doped, defining an "extrinsic" base, which is contrasted with a more lightly doped "intrinsic" base that contacts the emitter. The intrinsic base must be relatively lightly doped to establish a reasonable breakdown voltage between the intrinsic base and the heavily doped emitter. The intrinsic base can itself be subdivided into a center-base section below the emitter, and a link-base section between the emitter and the extrinsic base. This link-base section of the intrinsic base between the emitter and the extrinsic base can be more heavily doped than a center-base section of the intrinsic base below the emitter to reduce base resistance. The reduced base resistance results in a higher gain $\beta$, especially at higher currents. When the link-base section of the intrinsic base is more heavily doped, it is commonly referred to as a "link base".

A collector contact can be formed on the substrate surface at a location spaced from both the emitter contact and the base contact. Typically, a heavily doped collector sink is provided in the substrate to connect the collector contact with the collector. Where a subcollector is employed, the collector sink extends to the subcollector. Some bipolar transistors dispense with the collector contact; in such a case an interconnect or via can contact directly with the collector sink.

In general, the contacts to a transistor are to be electrically isolated from each other. A "field dielectric" isolates the collector contact from the emitter contact and the base contact; the field dielectric is typically silicon dioxide grown when the transistor active regions are defined. An "isolation dielectric" isolates the emitter contact from the base contact. The isolation dielectric can also be silicon dioxide; however, it is typically grown or deposited after the transistor active regions are defined.

The isolation dielectric can be the locus of a "hot-carrier effect" that causes the performance of a transistor to degrade over time. This degradation can cause a transistor to fall below specification around which a circuit was designed, causing the circuit to fail. The hot-carrier effect occurs when minority carriers in the base, e.g., electrons in the base of NPN bipolar transistor, inject into the isolation dielectric.

Normally, a potential barrier at the interface between the isolation dielectric and the link-base section is sufficient to prevent entry of electrons into the oxide. However, when a sufficiently strong reverse-bias (emitter at a higher potential than the base) field is applied, these electrons can have enough energy to penetrate the potential barrier and travel into the isolation dielectric. Such a reverse-bias field can be applied, for example, in emitter-coupled logic circuits by design or momentarily during certain voltage transitions. The reverse-bias field draws electrons from the extrinsic base through the link-base section and accelerates them toward the emitter. Collisions can divert an accelerated electron toward the dielectric so that it penetrates the interface.

The electrons that penetrate the base-dielectric interface lose energy in the process and are trapped in the dielectric. In the process of penetrating the potential barrier, the electrons deteriorate the potential barrier and create interface states, which make it easier for electrons with lower energies to be trapped in the deteriorated interface. Degradation of the potential barrier can progress until even the relatively low-energy electrons associated with forward bias conditions can penetrate the barrier and be trapped in the dielectric or increase interface states.

The electrons that penetrate the interface recombine with holes later, leaving vacancies in the interface. The vacancies will continue to trap additional electrons, resulting in a loss of current gain. Moreover, the trapped electrons can establish fields that attract majority carriers in the link-base section just below the isolation oxide. The accumulated majority carriers increase the likelihood of recombination of electrons injected from the emitter into the base, again adversely affecting transistor gain.

A laterally graded emitter can be used to reduce the hot-carrier effect as disclosed by Honda et al. in "Suppression of Hot Carrier Effects by Laterally Graded Emitter Structure in BiCMOS", *IEDM Technical Digest*, 1990, pp. 227-230. In the disclosed device, a lightly doped n-type region extends from a heavily doped n-type epi-emitter into a lightly doped p-type link-base section of an intrinsic base between the epi-emitter and the extrinsic base. The p/n junction is thus between two lightly doped regions, resulting in a smaller peak electric field strength. Thus, electrons undergo less acceleration and are less likely to be injected into the oxide. Thus, the hot-carrier effect is reduced and performance impairment is diminished.

An disadvantage of the method disclosed by Honda et al. is that the resulting devices are prone to defective junctions between the emitter and the intrinsic base. Since a light implant precedes a heavy implant, there is a likelihood that the light implant will be driven deeper than the heavy implant. The result is an emitter that is not only laterally graded, but also vertically graded. The vertically graded emitter would result in a less efficient electron injection into and through the intrinsic base, impairing performance.

Moreover, the method of fabrication disclosed by Honda et al. does not readily accommodate a higher-performance deposit-type emitter. Specifically, there is no suggestion as to how one would position a polysilicon emitter structure with appropriate precision between the light emitter implant and the subsequent heavy emitter implant.

What is needed is to take advantage of both laterally-graded emitter and deposit-type emitter technologies. This should be done so as to minimize the disadvantages, as described above, that can apply to deposit-type emitters. Finally, it is desirable to accomplish all this in a manner compatible with BICMOS technology, including advanced techniques such as split poly.

SUMMARY OF THE INVENTION

In accordance with the present invention, a large angle emitter buffer implant and a normal (orthogonal) base implant are performed using the same mask. The large angle emitter implant results in an emitter buffer being defined near mask edges. Then an oxide is grown over the implanted areas. Contact material, preferably polysilicon, is deposited over exposed silicon and the oxide. The contact material is patterned to define contacts, including a contact structure for the eventual deposit-type emitter. An emitter implant renders the contact structure conductive. A subsequent drive-in forms a substrate emitter section and serves to drive the emitter buffer further under the oxide. More conventional steps are used to define the collector and other parts of the base.

When the contact material is patterned, it is etched over the oxide. The etch can be optically monitored, and thus halted when oxide is exposed. In the resulting bipolar transistor, the oxide separates the emitter contact structure and the emitter buffer. (Of course the contact and buffer are electrically coupled through the emitter substrate section). The emitter buffer minimizes the hot carrier effect. The oxide permits the contact structure to extend laterally beyond the emitter substrate section. This provides additional masking tolerance for metallization vias to the emitter. In contrast to Honda, the emitter buffer and the emitter substrate section are implanted through distinct areas of the substrate. This minuses the chances that a vertically-graded emitter can form.

The inventive method is compatible with BICMOS technology. A single polysilicon layer can be patterned to provide gates, source and drain contacts, base contacts, as well as emitter contact structures. The same layer of polysilicon can provide for local interconnects. Polysilicon contacts and interconnects must be doped to render them conductive. In dual-gate processes, it is convenient to dope the contacts to NMOS devices n-type and the contacts to PMOS devices p-type. Accordingly, BiCMOS devices can have interconnects that have pn diode junctions where n-type and p-type dopings meet. By depositing silicide over the polysilicon and patterning the silicide and polysilicon together, the conductive silicide can short the junctions, overcoming any adverse affects of such junctions.

The present invention provides a self-aligned deposit-type laterally-graded emitter to minimize hot-carrier effects. The oxide growth over the lateral emitter implant area serves as an observable etch stop for the emitter contact structure. This approach allows the emitter contact structure to extend beyond the emitter substrate section; this in turn relaxes metallization via tolerances. The whole process is completely compatible with BiCMOS technology, providing a conductive layer over polysilicon to short diode junctions in interconnects formed using dual-gate techniques. These and other features and advantages of the present invention are apparent from the description below with reference to the following drawings.

BRIEF DESCRIPTION OF THE DRAWINGS

In the drawings, the hatching of the monocrystalline and polycrystalline silicon roughly indicates doping type and concentration. P-type doping is represented by a positive slope and n-type doping is represented by a negative slope. The steepness of the slope roughly correlates with doping concentration. This convention is applied only to semiconductor materials; hatching of conductive and dielectric materials does not reflect conductivity. Elements of silicon dioxide are not hatched.

DESCRIPTION OF THE PREFERRED EMBODIMENTS

Figure 1:
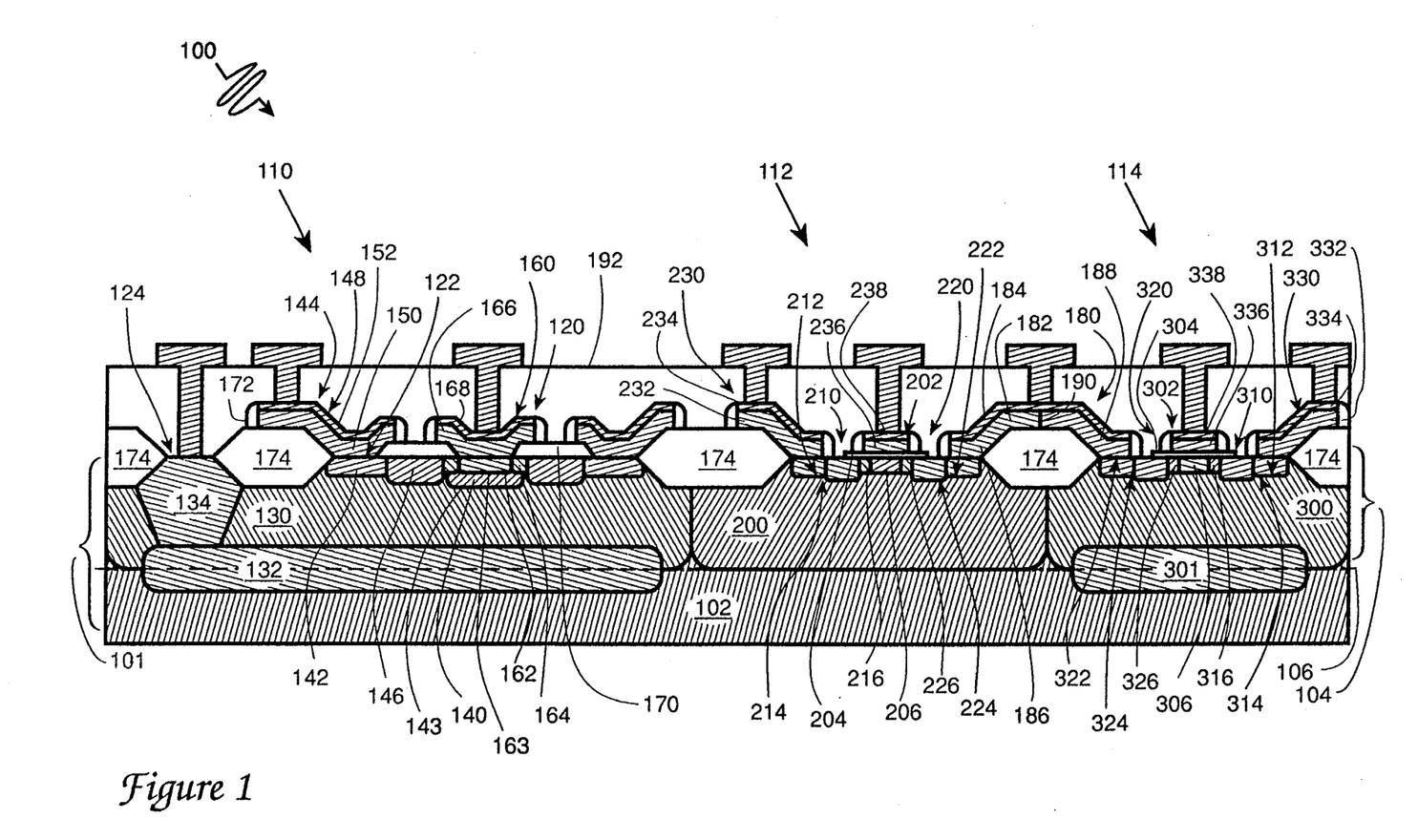
FIG. 1 is an elevational view of portion of a BiCMOS integrated circuit in accordance with the present invention.

A BiCMOS integrated circuit 100 has a substrate 101; substrate 101 includes a wafer crystal 102 and an epitaxial layer 104 formed over wafer crystal 102, as shown in FIG. 1. Epitaxial layer 104 extends from a crystal-/epitaxial interface 106 with wafer crystal 102 up to a substrate surface 108. Fabricated in wafer 100 is an NPN bipolar transistor 110, an NMOS (n-channel "metal"-oxide-silicon) transistor 112 and a PMOS (p-channel "metal"-oxide-silicon) transistor 114. ("Metal" is in quotes because, while aluminum was historically the preferred gate material, today doped polysilicon is commonly used for the gate material.)

Bipolar transistor 110 comprises a laterally-graded deposit type emitter 120, a base 122 and a collector 124. Collector 124 includes a collector drift region 130, a subcollector 132 and a collector sink 134. Base 122 includes an intrinsic base 140 and an extrinsic base 142. A pn junction 143 is defined by collector drift region 130 and intrinsic base 140. Extrinsic base 142 includes a base contact section 144 and a link-base section 146. A base contact 148 provides electrical access to base 122 through its contact with base contact section 144. Base contact 148 includes a polysilicon section 150 and a tungseten silicide (or other polycide) overlayer 152.

Emitter 120 includes a contact structure 160, a substrate section 162 and an emitter buffer 164. A pn junction 163 is defined by substrate section 162 and intrinsic base 140. Emitter contact structure 160 includes a polysilicon section 166 and a tungsten silicide cap 168. A "base" oxide growth 170 over link base section 146 vertically separates contact structure 160 and buffer 164. While buffer 164 and contact structure 160 are electrically coupled through substrate section 162, there is no direct electrical path between them. Oxide sidewalls 172 are formed on the sides of emitter contact structure 160 and base contact 148. Field oxides 174 electrically isolate active regions of transistors 110, 112 and 114 from each other and from other devices formed in wafer 100. In addition, field oxide 174 isolates collector sink 134 from extrinsic base 142.

NMOS transistor 112 is formed in a p-well 200. NMOS transistor 112 includes a gate 202, a gate oxide 204, a source 210, a drain 220, an n-channel 206 extending below gate oxide 204 and between source 210 and drain 220. Source 210 includes a source contact section 212, a main source section 214, and a source buffer 216; drain 220 includes a drain contact section 222, a main drain section 224, and a drain buffer 226. A source contact 230 provides electrical access to source 210 through its connection with source contact section 212. Source contact 230 includes a polysilicon layer 232 and a tunsten silicide cap 234. Likewise, gate 202 includes a polysilicon layer 236 and a tungsten silicide cap 238.

PMOS transistor 114 is formed in an n-well 300 with a buried bottom 301 to minimize the latch-up effect. PMOS transistor includes a gate 302, a gate oxide 304, a source 310, a drain 320, an n-channel 306 extending below gate oxide 304 and between source 310 and drain 320. Source 310 includes a source contact section 312, a main source section 314, and a source buffer 316; drain 320 includes a drain contact section 322, a main drain section 324, and a drain buffer 326. A source contact 330 provides electrical access to source 310 via its connection to source contact section 312. Source contact 330 includes a polysilicon layer 332 and a tunsten silicide cap 334. Likewise, gate 302 includes a polysilicon layer 336 and a tungsten silicide cap 338.

NMOS drain 220 and PMOS drain 320 are electrically coupled via an interconnect 180. Interconnect 180 includes a polysilicon layer 182 and a tungsten silicide cap 184. Polysilicon interconnect layer 182 is doped n-type over a segment 186 extending over NMOS transistor 112 and is doped p-type over a segment 188 extending over PMOS transistor 114. Accordingly, a pn diode junction 190 is defined at the mutual boundary of sections 186 and 188. Tungsten silicide cap 184 serves to short this diode junction to minimize any impairment of the interconnect 180. Drain interconnect defines an inverter in cooperation with NMOS transistor 112 and PMOS transistor 114. Oxide sidewalls 172 are formed at the sides of gates 202 and 302, source contacts 230 and 330, and interconnect 180.

A silicon dioxide dielectric 192 provides electrical isolation over transistors 110, 112 and 114. Metal interconnects 194, including vias, provide electrical access to collector sink 134, base contact 148, emitter contact structure 160, and NMOS source contact 230.

Figure 2:
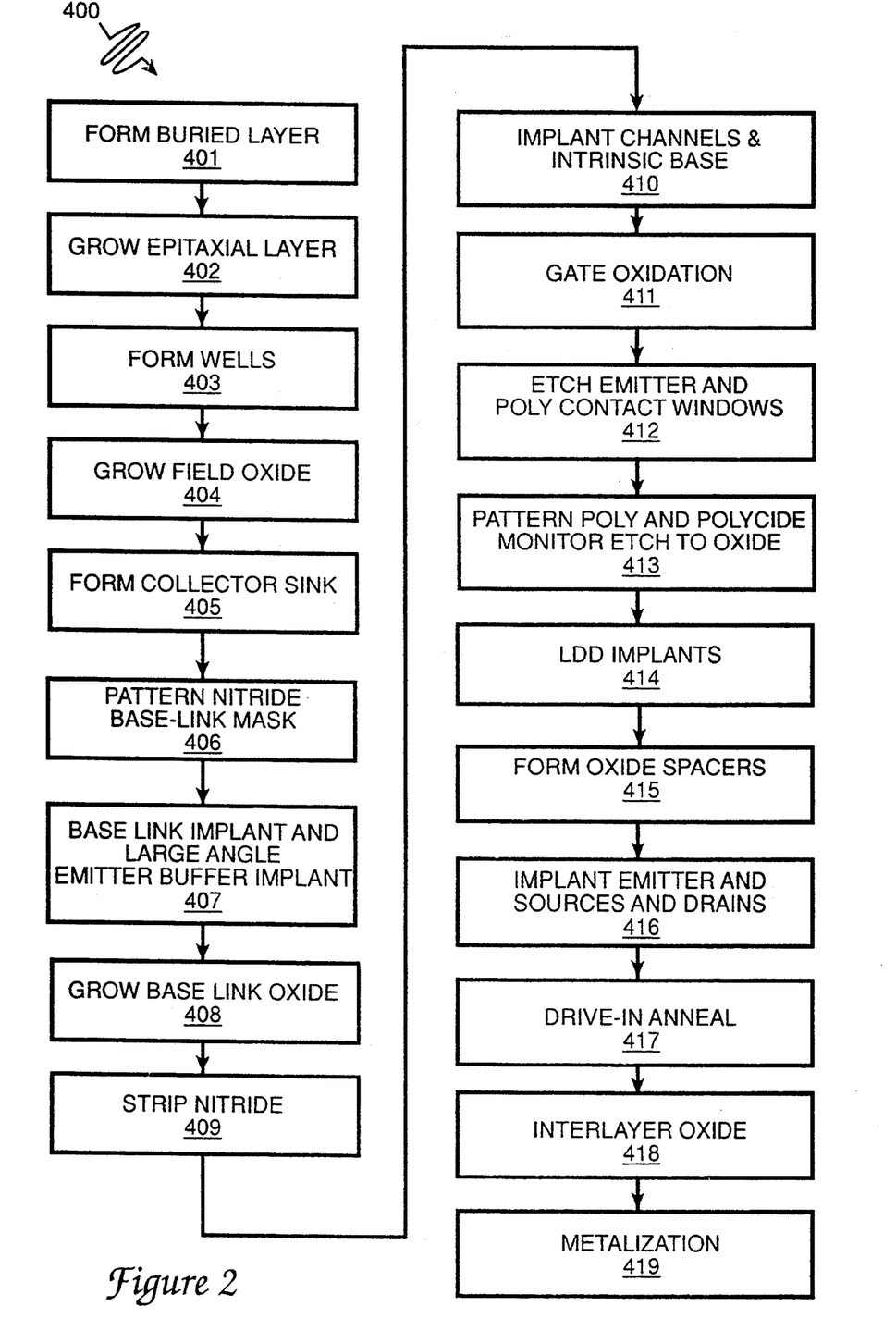
FIG. 2 is a flow chart of a method of fabricating the BiCMOS integrated circuit of FIG. 1 in accordance with the present invention.

In accordance with the present invention, integrated circuit 100 is fabricated in accordance with a BiCMOS method 400, flow charted in FIG. 2. Method 400 begins with a conventional series of steps through formation of collector sink 134. Beginning with p-type substrate 102, step 401 involves an appropriate masking and an n++ "buried layer" implant. At step 402, a p− epitaxial growth provides epitaxial layer 104 and buries the subcollector implant. During the thermally elevated step of forming the epitaxial layer, the subcollector implant diffuses into substrate 102 and epitaxial layer 104 to form subcollector 132 and n-well bottom 301.

Conventional twin-well formation, at step 403, provides regions of n-type and p-type dopant in epitaxial layer 104. The p-type regions serve as p-wells 200 for NMOS transistors, such as NMOS transistor 112. The n-type regions serve as n-wells 300 for PMOS transistors, such as PMOS transistors 114. Other n-type regions serve as collector drift regions 130 for bipolar transistors, such as bipolar transistor 110.

A field-oxide pattern is masked, and epitaxial layer 104 is etched through the pattern to provide sites for field oxide 174, which is then grown thermally at step 404. Formation of collector sink 134, at step 405, then proceeds by forming a sink mask, implanting n-type dopant, and driving in the dopant. The resulting structure is shown in FIG. 3A.

Figure 3A:
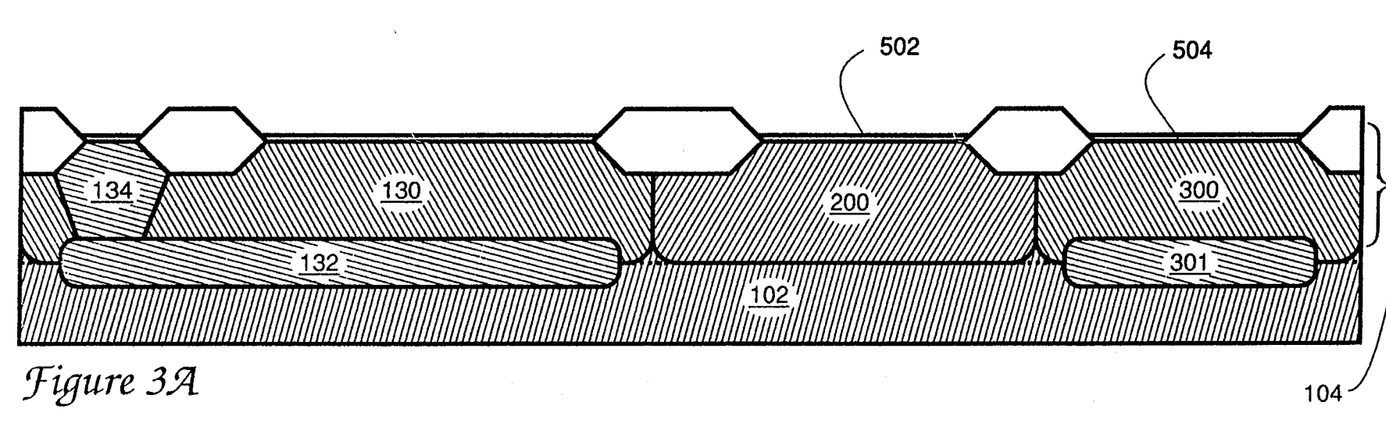
FIGS. 3A-3F are elevational views of the transistor of FIG. 1 during steps of the method of FIG. 2.

For completeness, it is noted that a pad oxide 502 is grown over exposed areas of an upper surface 504 of epitaxial layer 104, as indicated in FIG. 3A. This pad oxide protects the epitaxial layer from contamination and from physical damage during implants. In addition, it helps distribute implant dopant, preventing the formation of channels in the regular crystalline structure of epitaxial layer 104. Pad oxide 502 is first formed prior to twin-well formation, and is regrown as needed throughout method 400. In addition, where an especially uncontaminated pad oxide is desired, a "sacrificial oxide" can be grown, and removed, prior to the growth of a pad oxide 504. These steps are completely conventional and are separately identified in FIG. 2.

At step 406, silicon nitride 506 is deposited and then patterned to expose base regions in epitaxial layer 104. In method 400, these base regions are the sites for link-base sections 146. However, the present invention also provides for bipolar transistors without link bases. In such cases, step 406 would expose a region corresponding to an entire extrinsic base. This approach could also be used with a link base, by following a relatively light entire extrinsic base doping with a subsequent supplemental doping of the extrinsic base outside the link base region. Step 406 leaves MOS transistors 112 and 114 completely masked.

Figure 3B:
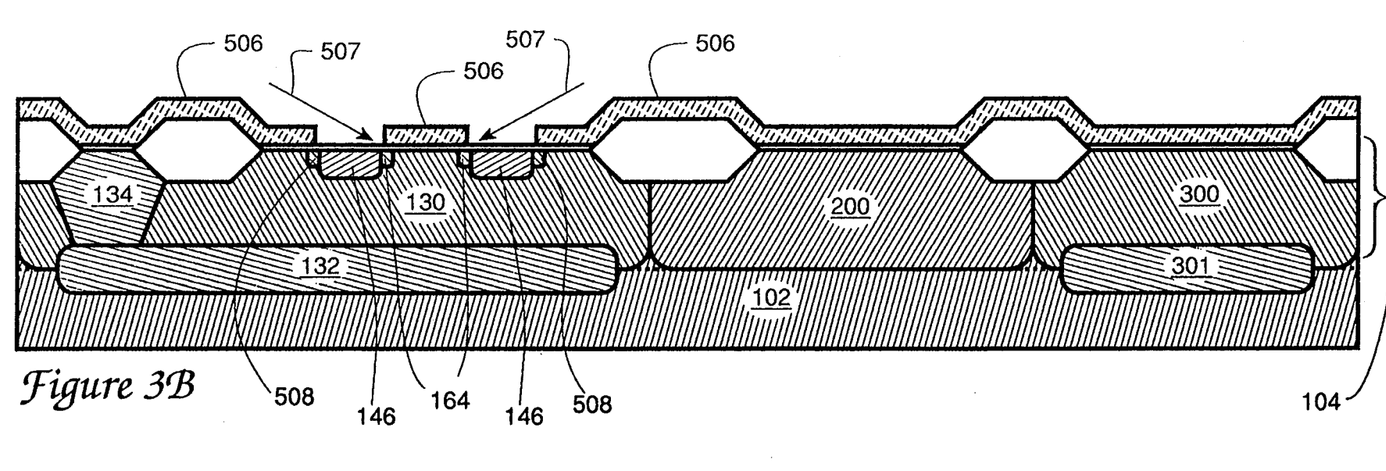

Critical step 407 involves two implants, either of which can be performed first. A link base (or extrinsic base) implant is performed normal (orthogonal) to upper surface 504 of epitaxial layer 104, defining link base section 146. An emitter buffer implant is performed at a large angle relative to the normal to upper surface 504. This large angle (indicated by arrows 507) is at least 30° and preferably about 60°. The base link doping is heavier so that in the common implant region, the net doping is p-type. At and beyond the edges of silicon nitride 506, the n-type dopant is dominant. The radially inward portion of the predominantly n-type implant region becomes emitter buffer 164. As an artifact of the large angle implant, a radically outward n-type region 508 is defined. This will be nullified by a subsequent heavy extrinsic base implant. In the preferred method, the p-type dopant is boron and the n-type dopant is arsenic (phosphorus is an alternative). The diffusivity of boron in silicon is much greater than that of arsenic, so link base section 146 is deeper than emitter buffer 164, as indicated in FIG. 3B.

Figure 3C:
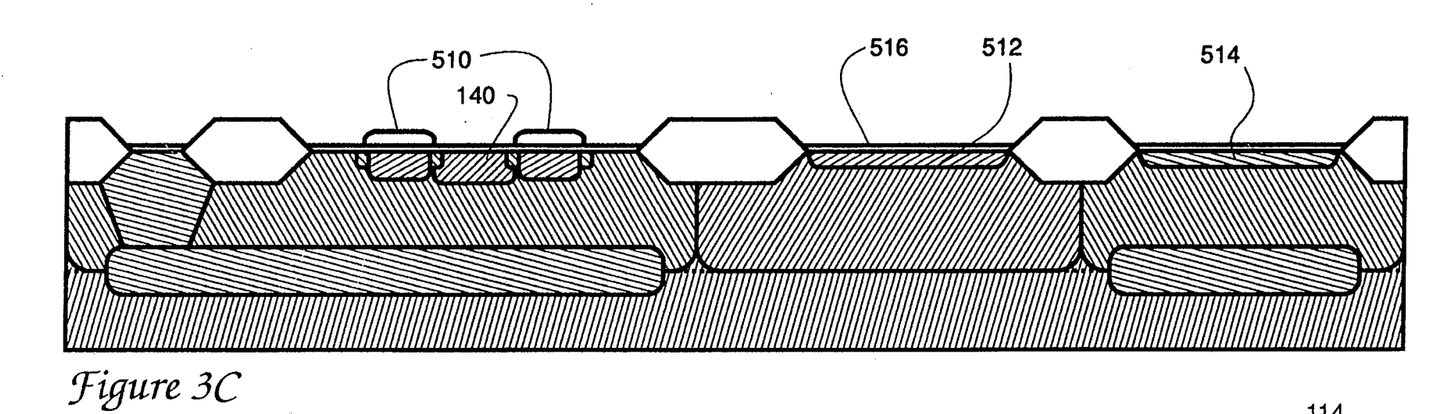

A thermal oxidation at step 408 grows oxide over the region of the implants of step 407, resulting in oxide growth 510, shown in FIG. 3C. The silicon nitride is then stripped, at step 409. A sacrificial oxide and a pad oxide follow. Oxide growth 510 after subsequent modifications becomes base oxide 170.

Channel implants are performed at step 410. Photoresist is patterned to expose the NMOS transistor regions; an n-type implant yields n-channel implants 512. The n-channel photoresist is stripped. New photoresist is patterned to expose the PMOS transistor regions. A p-type implant yields p-channel implants 514. The concentrations of the channel implants are selected so that the eventual threshold voltages Vt are at levels specified by circuit designers, e.g., about 0.7 volts. The n-channel and p-channel implants can be performed in either order. Intrinsic base implant is performed with a masking step to form intrinsic base region 140.

A gate oxidation is performed at step 411, resulting in an oxide layer 516. Oxide layer 516 provides the oxide for gate oxides 204 and 304. The resulting structure is shown in FIG. 3C.

Figure 3D:
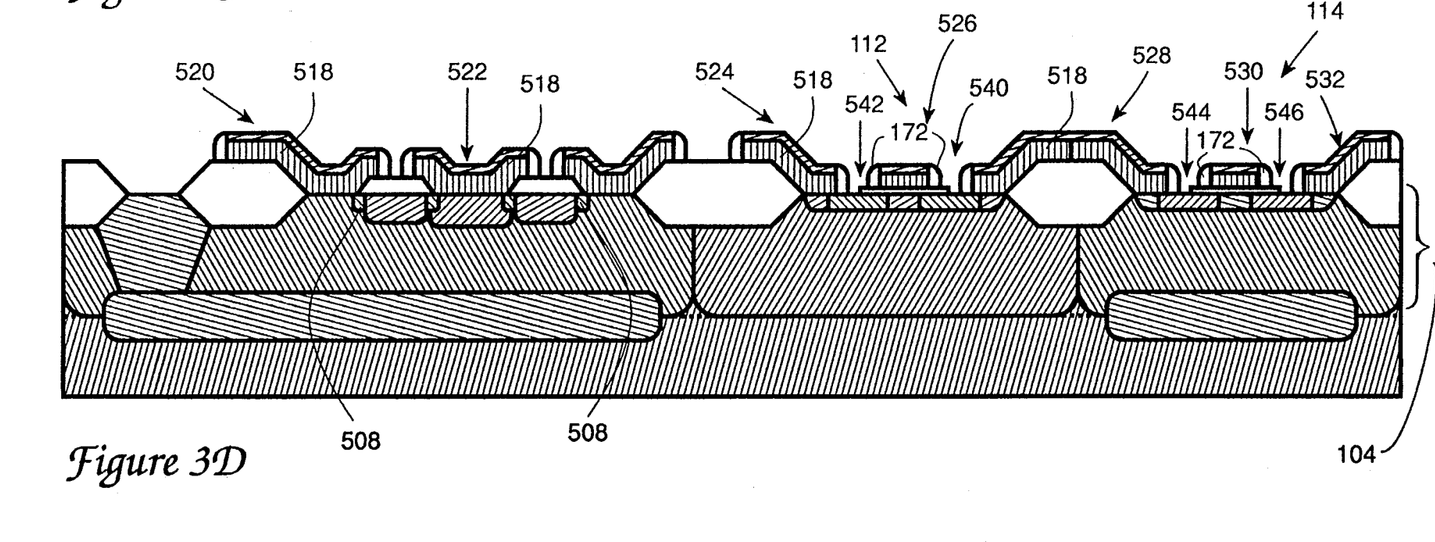

The gate oxide is etched to form windows for polysilicon contacts and for the emitter at step 412. Polysilicon 516 is deposited over the oxide and the exposed monocrystalline silicon of epitaxial layer 104. Tungsten silicide 518 is deposited over the polysilicon at step 413, which further involves patterning both deposited layers as indicated in FIG. 3D. Note that the deposit and patterned materials define undoped structures including a base contact structure 520, an emitter contact structure 522, an NMOS source contact structure 524, an NMOS gate 526, an interconnect structure 528, a PMOS gate 530, and a PMOS source contact 532.

Figure 3E:
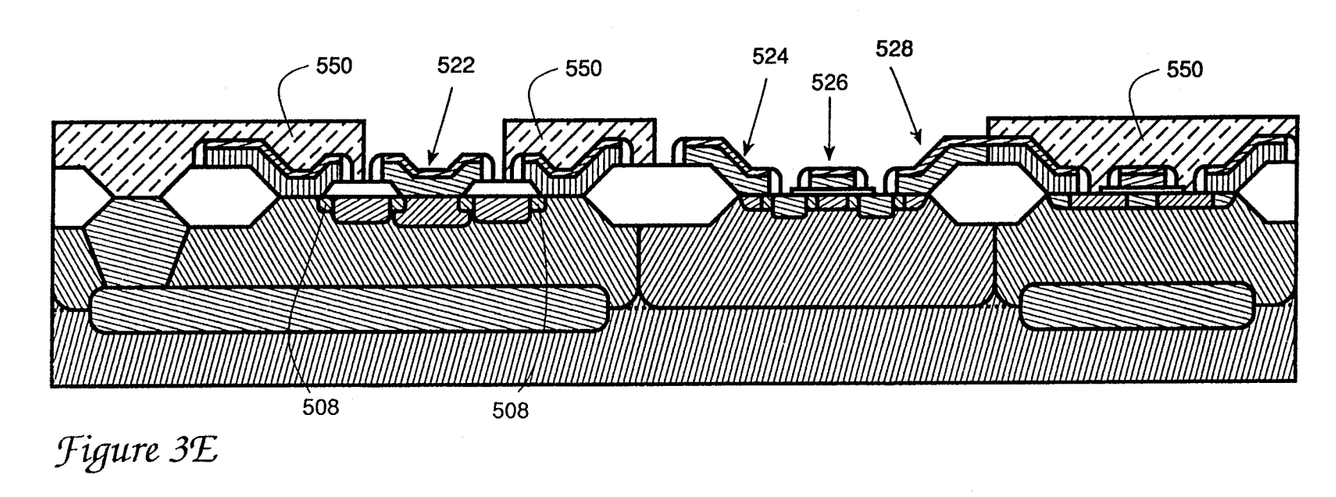

"Lightly doped drain" implants are performed at step 414 to extend hot carrier lifetimes. A photoresist mask leaves NMOS transistors 112 exposed during an n-type implant, defining lightly doped drain region 540 and a lightly doped source region 542. The photoresist is removed. A new photoresist mask leaves PMOS transistors 114 exposed. A p-type implant defines lightly doped drain region 544 and a lightly doped source region 546. Oxide is grown; an anisotropical etch follows, resulting in sidewalls 172 on the exposed sides of the polysilicon and the tungsten silicide, at step 415. The result is indicated in FIG. 3E.

Figure 3F:
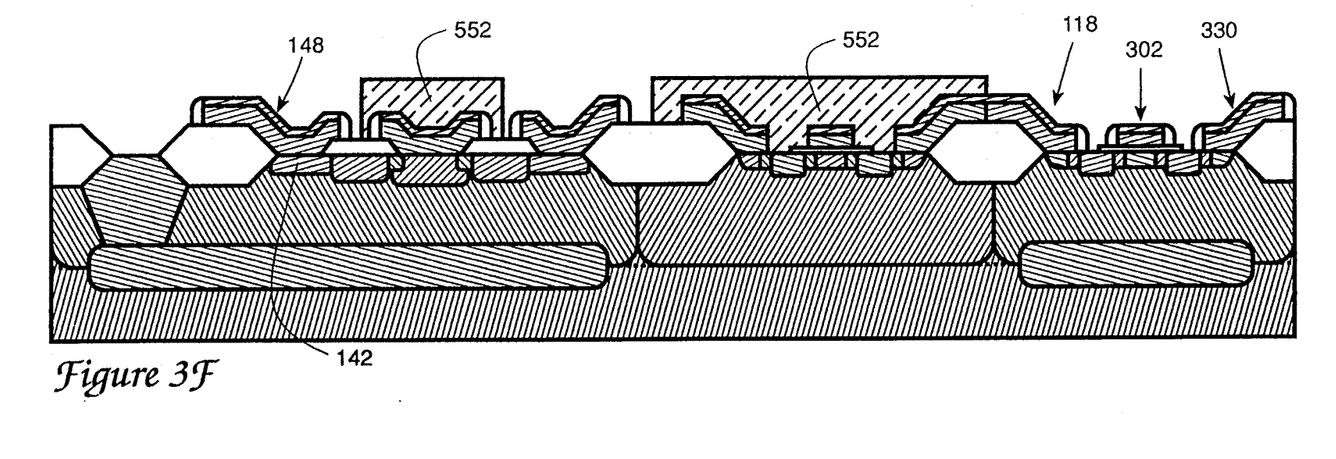

Source, drain and emitter implants are performed at step 216. Photoresist 550 is patterned as shown in FIG. 3E. An n+ implant introduces arsenic into emitter contact structure 522, NMOS source contact structure 524, NMOS gate 526 and an exposed portion of interconnect structure 528. The structures thus doped are rendered conductive, thereby providing emitter contact section 160, NMOS source contact 230, NMOS gate 202, and n-type segment 186 of what is to be interconnect 180. Photoresist 552 is patterned as shown in FIG. 3F. The following p-type implant dopes the polysilicon structure that were not converted to n-type during the emitter implant. Thus, base contact 148, p-type segment 188 of interconnect 180, PMOS gate 302, and PMOS source contact 330 are defined. The resulting structure is shown in FIG. 3F. Of course, the order of the emitter and corresponding p-type implants can be reversed.

A dopant drive-in and an anneal at step 417 causes dopant in the polysilicon structures to diffuse into epitaxial layer 104, thus forming extrinsic base 142, emitter substrate section 162, NMOS source contact section 212, NMOS drain contact section 222, PMOS drain contact sections 322, and PMOS source contact section 312. The heavy doping associated with extrinsic base 142 obliterates outer n-type region 508 (FIGS. 3B-3E) by reversing the net doping type. The emitter drive in forces emitter buffer 164 under base oxide 170 by increasing the concentration of dopant directly beneath the boundary of emitter contact section and emitter substrate section. Likewise, diffusion from source contacts 230 and 330 and interconnect 180 dominate formerly lightly doped regions to the contact sides of NMOS source 210, NMOS drain 220, PMOS source 310 and PMOS drain 320. In practice, the emitter drive and anneal can begin before the p-type implant of step 216, followed by another drive in and anneal after the p-type implant. So steps 416 and 417 can overlap chronologically.

A dielectric layer 192, preferably of silicon dioxide, can be deposited over the structure of FIG. 3F to provide electrical isolation for the contacts and local interconnects at step 418. Vias can be defined in the dielectric as preparation for step 419. Step 419 is a metal, preferably aluminum, deposition. During deposition, metal fills the vias to provide electrical access to collector sink 134, base contact 148, emitter contact section 160, NMOS source contact 230, NMOS gate 202, interconnect 180, PMOS gate 302, and PMOS source contact 330. Metal above the dielectric is patterned to define a layer of interconnects among the transistors of BiCMOS integrated circuit 100. The resulting structure is represented in FIG. 1.

While the steps of method 400 were described in a particular order, those skilled in the art would recognize that some steps can be reordered or modified to yield the same or similar structure. Some of these variations were indicated in the description above.

The present invention provides for PNP bipolar transistors as well an NPN transistor. The structure and method for fabricating a PNP bipolar transistors can be extrapolated from the above description relating to NPN transistor 110 by reversing conductivity types of dopants and regions.

The present invention applies to integrated circuits employing subcollectors and those that do not. Where no subcollector is employed, there may not be an epitaxial layer. Accordingly, the term "substrate" as used herein refers to the crystalline semiconductor material that is selectively doped to define various active transistor components. "Substrate" can encompass either or both of a wafer crystal and an epitaxial layer.

"Semiconductive", where used herein, refers to a structure wherein a current is dominated by either electrons or electron holes to the relative exclusion of the other. A "semiconductor structure" is one that when doped becomes semiconductive. A "semiconductor material" is one from which a semiconductor structure can be made. Polycrystalline silicon is of semiconductor material, but a structure of doped polycrystalline silicon is a conductor and is conductive, and is not a semiconductor nor is it semiconductive. An undoped crystalline substrate would be a semiconductor but not semiconductive. The present invention provides for the use of silicon as well as other semiconductor materials. The present invention applies to integrated circuits employing silicon, germanium, gallium arsenide, aluminum gallium arsenide, and other semiconductor materials. Other dielectrics such as silicon nitride can be used as the isolation dielectric.

A "deposit-type emitter" is one that includes a substrate section and a contact section. The two sections are commonly doped. However, the substrate section is typically crystalline and the contact section is typically polycrystalline or amorphous. Thus, the contact section is relatively conductive while the substrate section is relatively semiconductive.

The "contact section" of the extrinsic base is below the base contact. The link-base section is the part of the extrinsic base between the contact base and the intrinsic base (and the emitter).

Herein, a "contact structure" is a structure that will serve as a conductive contact once it has been appropriately doped. The contacts in the present invention are of polycrystalline semiconductor material. The invention also provides for contacts of doped amorphous semiconductor material. These and other modifications to and variations upon the preferred embodiments are provided for by the present invention, the scope of which is limited only by the following claims.

I claim:

1. In a method for forming an integrated circuit including a bipolar transistor, the steps of:
   masking a monocrystalline layer having an upper surface;
   while said masking is in effect, implanting a base-type dopant by directing it orthogonally toward said upper surface and into said crystalline layer;
   while said masking is in effect, implanting an emitter-type dopant by directing it at an angle of at least 30° relative to an orthogonal to said upper surface and into said crystalline layer so that said emitter-type dopant extends partially under said masking to define an emitter buffer;
   while said masking is in effect and after said base and emitter implanting have been effected, growing an oxide on the unmasked areas of said crystalline layer;
   removing said masking;
   depositing polysilicon over said upper surface and said oxide;
   patterning said polysilicon to define a polycrystalline contact structure for a deposit-type emitter, said patterning involving etching said polysilicon to said oxide so that said contact structure contacts said upper surface and also contacts said oxide directly over at least a portion of said emitter buffer; and
   implanting emitter dopant into said contact structure so as to define a deposit-type emitter contact section by rendering said contact structure conductive; and
   driving the emitter dopant in said contact structure into said monocrystalline layer so that it contacts said emitter buffer, thereby defining a deposit-type emitter substrate section.

2. In a method as recited in claim 1 wherein said patterning involves etching said polysilicon so that said contact structure extends partially over said oxide.

3. In a method as recited in claim 2 further comprising optically monitoring the effects of said etching so that etching can be halted when said oxide is exposed by said etching.

4. In a method as recited in claim 1, the further step of:
   before patterning said polysilicon, depositing a conductive material on said polysilicon, said patterning step involving patterning said conductive material, whereby pn junctions subsequently defined in said polysilicon by doping are shorted by said conductive material.

* * * * *